United States Patent [19]

Farrington et al.

[11] Patent Number: 4,664,849
[45] Date of Patent: May 12, 1987

[54] OPTICAL MATERIALS FROM INTERCALATION OF POLYVALENT CATIONS IN BETA DOUBLE PRIME ALUMINA

[75] Inventors: Gregory C. Farrington, Wallingford, Pa.; Bruce S. Dunn, Los Angeles, Calif.

[73] Assignee: University Patents, Inc., Norwalk, Conn.

[21] Appl. No.: 509,237

[22] Filed: Jun. 29, 1983

[51] Int. Cl.$^4$ ................................................ H01S 3/16
[52] U.S. Cl. ............................. 252/647; 252/301.4 R; 372/39; 423/249; 423/263; 423/600
[58] Field of Search .................. 372/39; 252/301.4 R, 252/647; 423/263, 600, 249, 19

[56] References Cited

U.S. PATENT DOCUMENTS 4,376,709 3/1983 Johnson et al. ................... 423/600

OTHER PUBLICATIONS

Fast Ionic Transport in Solids, Farrington et al., Science, vol. 204, pp. 1371-1379 (1979).
Divalent Beta Aluminas: High Conductivity Solid Electrolytes for Divalent Cations, Farrington and Dunn, Solid State Ionics, vol. 7, No. 4, pp. 267-281 (1982).
Preparation, Structure, Optical and Magnetic Properties of Lanthanide Aluminate of Single Crystals ($LnMal_{11}O_{19}$), Kahn et al., Journal of Applied Physics, vol. 52, No. 11, pp. 6864-6869, (1981).
A Survey of Group Phosphors, Based on Hexagonal Aluminate and Gallate Host Lattices, Verstegen, Journal of the Electrochemical Society, vol. 121, No. 12, pp. 1623-1627 (1974).
Optical and Structural Investigation of the Lanthanum B-Alumina Phase Doped wih Europium, Dexpert-Ghys et al., Journal of Solid State Chemistry, vol. 19, pp. 193-204 (1976).
$EU^{2+}$ Luminescence in Hexagonal Aluminates Containing Large Divalent or Trivalent Cations, Stevels et al., Journal of the Electrochemical Society, vol. 123, No. 5, pp. 691-697 (1976).
Properties of B-Alumina Doped with Cerium, Kennedy et al., Journal of Solid State Chemistry, vol. 42, pp. 170-175 (1982).
The Relation Between Crystal Structure and Luminescence in B-Alumina and Magnetoplumbits Phases, Verstegen et al., Journal of Luminenscene, vol. 9, pp. 406-414 (1974).
X-Ray Diffuse Scattering from Alkali, Silver and Europium B-Alumina, McWhan et al., Physical Review B, vol. 17, No. 10 (1978).
$Mn^{2+}$ and $Tl^+$ Luminescence in B-Aluminas, Verstegen et al., Journal of Luminescence, vol. 10, pp. 31-38 (1975).
Effects of Defects on the Quantum Efficiency of $Eu^{2+}$-Doped Aluminates with the Magnetoplumbite-Type Crystal Structure, Stevels et al., Journal of Luminescence, vol. 14, pp. 147-152 (1976).

(List continued on next page.)

Primary Examiner—James W. Davie
Attorney, Agent, or Firm—Woodcock Washburn Kurtz Machiewicz & Norris

[57] ABSTRACT

Beta double prime alumina is provided having a sensible amount of at least one polyvalent cationic species intercalated therein. In accordance with a preferred embodiment, such beta double prime alumina is provided having trivalent and/or tetravalent cationic species intercalated therein, especially species derived from the lanthanide and actinide series of elements. Certain of the foregoing materials exhibit phosphorescence or fluorescence, and some are believed to be capable of producing laser emission upon suitable irradiation.

Methods for modifying beta double prime aluminas comprising contacting crystals of the aluminas with polyvalent cation-containing salts such as in the molten state or in the gaseous state are also provided. Laser and other optical devies are disclosed employing the modified beta double prime aluminas of this invention.

22 Claims, 1 Drawing Figure

OTHER PUBLICATIONS $Eu^{2+}$ $Mn^{2+}$ Energy Transfer in Hexagonal Aluminates, Steels et al., Journal of Luminescence, vol. 14, pp. 207–218 (1976).

Luminescence of (Sr, Ce)–Hexa-Aluminates, Alexander et al., Abstract No. 609, Extended Abstracts 83-1, Electrochemical Society Meeting, San Francisco, California, May 1983.

Solid State Ionics, vol. 7, 1982, pp. 267–281, G. C. Farrington et al.: "Divalent beta"–Aluminas: High Conductivity Solid Electrolytes for Divalent Cations", pp. 270–280.

Journal of the Electrochemical Society, vol. 121, No. 12, Dec. 1974, pp. 1623–1627; J.M.P.J. Verstegen: "A Survey of a Group of Phosphors, Based on Hexagonal Aluminate and Gallate Host Latices".

Applied Physics A. Solids and Surfaces, vol. A32, No. 3, Nov. 1983, pp. 159–161, Heidelberg, DE: G. C. Farrington et al.: "The Lanthanide Beta Aluminas".

OPTICAL MATERIALS FROM INTERCALATION OF POLYVALENT CATIONS IN BETA DOUBLE PRIME ALUMINA

ACKNOWLEDGEMENT

This invention was made with Government support from Subcontract ORA5-26899 under the Office of Naval Research Prime Contract No. N00014-81-K-0526 awarded by the Department of the Navy. The Government has certain rights to this Invention.

BACKGROUND OF THE INVENTION

This invention deals with the intercalation of polyvalent cations in the structure of beta double prime aluminas (BDPAs) and certain related species. This invention is also directed to methods for the intercalation of polyvalent cationic species in beta double prime aluminas, and with articles employing the modified double prime aluminas thus prepared. Devices which employ the fluorescent or phosphorescent character of certain of these modified materials together with devices which exploit the ability of certain of these materials to undergo laser emissions are also contemplated by the present invention.

Intercalation of monovalent and certain divalent cations in both beta alumina and beta double prime alumina is known. See in this regard, "Fast Ionic Transport in Solids", Farrington et al., Science, Vol. 204, pp. 1371-1379 (1979). Such cations of sodium, potassium, silver, copper, lithium, and certain other elements have been known to be conducted into and out of both of these materials. The conductivity of a cation in different alumina lattices depend on the energy of activation for the individual processes which, in turn, is related to an ion's size and its tendency to bond to oxygen atoms in the conduction planes of the various materials. Thus, for beta alumina, the energy of activation increases with increasing ionic size from sodium to rubidium. Increasing difficulties in intercalation are expected for beta alumina as larger ions are considered. It has been believed that similar relationships are extant for magnetoplumbites as well as for beta double prime aluminas.

The preparation of high conductivity solid electrolytes for divalent cations from beta double prime aluminas has been disclosed. See "Divalent Beta" Aluminas: High Conductivity Solid Electrolytes for Divalent Cations", Farrington and Dunn, Solid State Ionics, Vol. 7, No. 4, pp. 267-281 (1982). It was found that divalent cations could readily diffuse or intercalate into beta double prime alumina leaving the divalent ions intercalated therein. It was observed that divalent cations diffuse very slowly in beta alumina, however. While it was found that divalent cations may diffuse into beta double prime alumina to form intercalated structures, it has been assumed that cations having three, four, and higher positive charges, i.e. trivalent, tetravalent and higher cations (hereinafter collectively referred to as polyvalent cations) would not be capable of penetrating any of the alumina lattices including the beta double prime alumina structure. This assumption was supported by prior experimental data. Thus, for example, while the conductivity of sodium cations in beta double prime alumina is approximately $10^{-2}$ ohms$^{-1}$ cm$^{-1}$ at 25° C., the conductivity of (divalent) barium ions is approximately $10^{-7}$ ohms$^{-1}$ cm$^{-1}$ at 25° C. Even though these conductivities are substantially higher than those exhibited in beta alumina and magnetoplumbite, it has been generally anticipated that conductivity of trivalent cations (not to mention tetravalent cations) in any of the aluminas, including beta double prime alumina, would be vanishingly small or nonexistent.

In view of the foregoing considerations, the preparation of aluminas having polyvalent cationic species intercalated therein has not been heretofore attempted. Rather, others have attempted the preparation of, for example, lanthanide aluminate-type materials through high temperature synthesis or recrystallization. See "Preparation, Structure, Optical and Magnetic Properties of Lanthanide Aluminate Single Crystals (LnMAl$_{11}$O$_{19}$)", Kahn et al., Journal of Applied Physics, Vol. 52, No. 11, pp. 6864-6869 (1981); "A Survey of a Group of Phosphors, Based on Hexagonal Aluminate and Gallate Host Lattices", Verstegen, Journal of the Electrochemical Society, Vol. 121, No. 12, p. 1623-1627 (1974); "Optical and Structural Investigation of the Lanthanum $\beta$-Alumina Phase Doped With Europium", Dexpert-Ghys et al., Journal of Solid State Chemistry, Vol. 19, pp. 193-204 (1976); and "Eu$^{2+}$ Luminescence in Hexagonal Aluminates Containing Large Divalent or Trivalent Cations", Stevels et al., Journal of the Electrochemical Society, Vol. 123, No. 5, pp. 691-697 (197). See also "Properties of $\beta$-Alumina Doped With Cerium", Kennedy et al., Journal of Solid State Chemistry, Vol. 42, pp. 170-175 (1982); and "The Relation Between Crystal Structure and Luminescence in $\beta$-Alumina and Magnetoplumbite Phases", Verstegen et al., Journal of Luminescence, Vol. 9, pp. 406-414 (1974).

Other publications dealing with cationic substitution in beta alumina or magnetoplumbite type materials include "X-Ray Diffuse Scattering from Alkali, Silver and Europium $\beta$-Alumina", McWhan et al., Physical Review B, Vol. 17, No. 10 (1978); "Mn$^{2+}$ and Tl$^+$ Luminescence in $\beta$-Aluminas", Verstegen et al., Journal of Luminescence, Vol. 10, pp. 31-38 (1975); "Effects of Defects on the Quantum Efficiency of Eu$^{2+}$-Doped Aluminates with the Magnetoplumbite-Type Crystal Structure", Stevels et al., Journal of Luminescence, Vol. 14, pp. 147-152 (1976); "Eu$^{2+}$ Mn$^{2+}$ Energy Transfer in Hexagonal Aluminates", Stevels et al., Journal Of Luminescence, Vol. 14, pp. 207-218 (1976); and "Luminescence of (Sr, Ce)-Hexa-Aluminates", Alexander et al., Abstract No. 609, Extended Abstracts 83-1, Electrochemical Society Meeting San Francisco, Calif., May, 1983.

SUMMARY OF THE INVENTION

This invention provides beta double prime aluminas having sensible amounts of at least one polyvalent cationic specie intercalated therein. Such polyvalent cationic species may include trivalent, tetravalent and higher cations together with mixtures of such cations and mixtures of such cations with mono and divalent cations. Cations derived from the lanthanide and actinide series of elements are particularly preferred for use in accordance with certain of the embodiments of this invention by virtue of the utility of certain of such intercalated beta double prime aluminas in the generation of laser emissions and in certain other optical uses. Certain of the species in accordance with the present invention are also useful for fluorescent and/or phosphorescent applications such as in fluorescent lighting units, microcircuitry-based optical devices and other uses.

Methods for modifying beta double prime aluminas are also provided by the present invention. Thus, one or more crystals of a beta double prime alumina is provided and contacted with a material comprising at least one salt of a polyvalent cationic species. This contacting take place at a temperature and for a time sufficient to cause migrating of polyvalent cations from the salt into the crystals to a sensible degree through intercalation. In accordance with a preferred embodiment, the contacting takes place with the salt in a molten state. In one alternative embodiment, the contacting takes place in the vapor phase of the salt.

On application of suitable radiant energy to certain modified beta double prime aluminas in accordance with the present invention, it is believed to be possible to produce laser emissions. Optical devices, especially lasers, are also provided by the present invention comprising optical resonating means defining an optical pathway, a beta double prime alumina in the pathway having at least one polyvalent cationic species intercalated therein, and pumping means for supplying radiant energy to the modified beta double prime alumina. In accordance with another, preferred embodiment, single crystals of the beta double prime alumina are employed in lasers. In accordance with another preferred embodiment, switching means, such as a Q switch, is also provided.

Devices for the utilization of the fluorescent and phosphorescent nature of certain of the materials in accordance with the present invention are also contemplated hereby. Thus, means for directing radiant energy upon a beta double prime alumina having trivalent cationic species intercalated therein may be constructed to result in the induction of phosphorescence or fluorescence in the exposed material. In accordance with a preferred embodiment, a single crystal of the beta double prime alumina is so exposed.

A principle object of the present invention is to provide beta double prime aluminas having a sensible amount of at least one polyvalent cationic species intercalated therein.

Another object is to provide such BDPAs further comprising additional polyvalent cationic species or one or more mono- or divalent cationic species.

BDPA's having intercalated trivalent or tetravalent cations, especially those from the lanthanide and actinide series of elements, are also a principal object of this invention.

BDPA materials exhibiting sensible phosphorescence or fluorescence upon exposure to radiant energy are further objects of this invention.

Yet another object is the provision of materials suitable for the production of laser emissions.

LASER and other optical devices employing the materials and process of this invention are further objects of this invention.

A still further object is to modify a beta double prime alumina by contacting crystals of such alumina with a material comprising at least one salt of a polyvalent cationic species for a time and at a temperature sufficient to cause migration of polyvalent cations into the crystals to effect intercalation thereof.

Such methods are provided in accordance with a further object of this invention wherein such contact is accomplished in the molten state of the salt or in its vapor phase.

Still other optical devices are objects of the present invention. Thus, fluorescent or phosphorescent devices comprising beta double prime aluminas are contemplated.

These and other objects will become apparent from review of the present specification.

Figure 1:
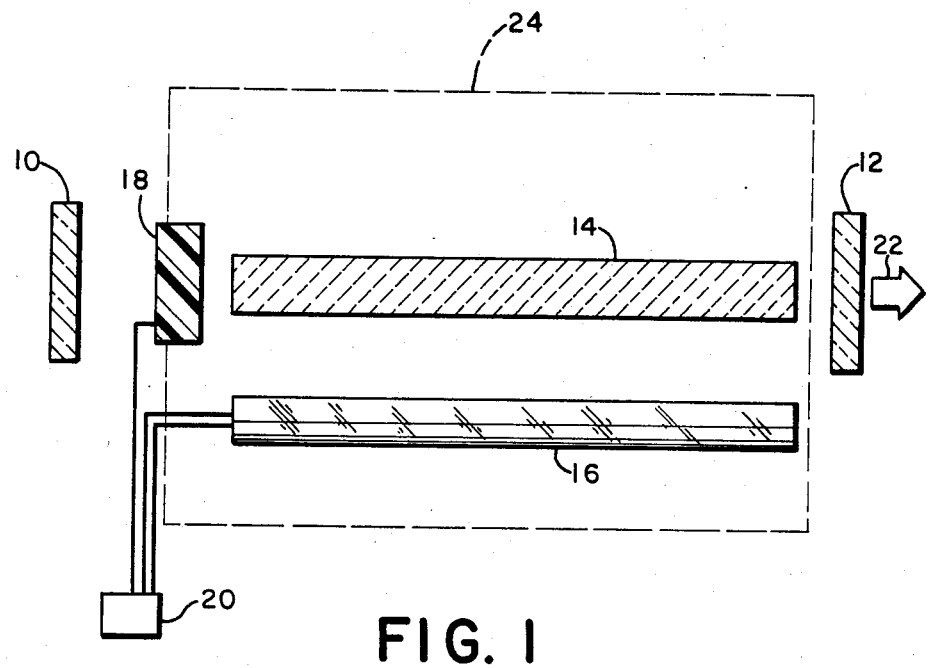
FIG. 1 is a schematic diagram of an optical device in accordance with certain preferred embodiments Of the present invention.

Beta double prime aluminas, also referred to herein as BDPAs, and certain closely related species are materials of principal importance in connection with the practice of the present invention. Beta double prime alumina must be clearly distinguished from beta alumina, a related, but totally distinct and different structural entity. The beta double prime alumina structure must also be clearly distinguished from that of magnetoplumbite, a sodium aluminate having different properties from each of beta alumina and beta double prime alumina. In their most common forms, each of the foregoing is, nominally, a sodium aluminate, an alumina having sodium ions in the conduction planes of the respective crystal lattices.

Certain distinctions among the three foregoing structures, beta double prime alumina, beta alumina, and magnetoplumbite, may conveniently be referred to. Both beta alumina and magnetoplumbite exhibit c crystal lattice parameters of approximately 22 Angstroms. Beta double prime alumina, on the other hand, exhibits a c crystal lattice parameter of approximately 33 Angstroms. See in this regard "The Identification of the $\beta$-Alumina Type Faces" Dyson et al, Transactions, Journal of the British Ceramic Society, Volume 72, pp. 49–55 (1973) and "The Crystal Structure of $Na_2O/MgO/5Al_2O_3$ With Reference To $Na_2O/5Al_2O_3$ and Other Isotypal Compounds", Bettman et al, Journal of Physical Chemistry, Volume 73, No. 6, pp. 1774–1780 (1969). Moreover, both beta alumina and magnetoplumbite have hexagonal P6₃mmc crystal space groups while beta double prime alumina is rhombohedral having an R$\bar{3}$m space group. See "Preparation, Structure, Optical and Magnetic Properties of Lanthanide Aluminate Single Crystals ($LnMA_{11}O_{19}$)", Kahn et al., Journal of Applied Physics, Volume 52 (11), pp. 6864–6869 (1981) and "The Behavior of Phosphors With Aluminate Host Lattices", Sommerdijk et al., Philips Technical Review, Volume 37, No. 9–10, pp. 221–233 (1977). Each of the foregoing publications is incorporated herein by reference.

As will be appreciated by those skilled in the art, other "beta double prime aluminas" may be formed either from a native inorganic synthesis, or by ion exchange, intercalation, from native beta double prime aluminas. Thus, lithium, potassium, rubidium, and other alkali metal beta double prime aluminas can be readily prepared or formed through the monovalent cationic exchange of sodium beta double prime alumina and the corresponding alkali metal salt. Since divalent cations may be substituted into beta double prime alumina structures by ion exchange or intercalation, these materials may, similarly, be employed as starting materials in the practice of one or more embodiments of the present invention. Thus, magnesium, calcium, strontium, barium, silver, and other divalent, cationic beta double prime aluminas prepared by intercalation may be considered to be starting materials vis-a-vis the methods of the present invention.

As will be appreciated by those skilled in the art, certain other materials have crystal structures which are similar to that exhibited by beta double prime aluminas. Thus, certain gallates may also be considered to be appropriate starting materials for the practice of one or more embodiments of the present invention. While no experimental verification of the utility of gallates in the present process has yet been had, it is anticipated that such gallates will show utility.

The term intercalation has been selected for use herein to refer to a process whereby cations are included within conduction bands or planes of the crystal lattice structure of an alumina or related species as a regular part of that structure through a process of substitution, either in part or in toto, for other cations previously present in those bands. In accordance with the present invention, different cationic species may be substituted for the sodium cations of native sodium beta double prime alumina or in other pure or mixed cationic Beta double prime aluminas and certain related species to result in beta double prime aluminas having different species present in some or all of the portions in the conduction bands or planes formerly occupied by (inter alia) sodium. Thus, intercalation differs from a process whereby cationic species are included within the structure of an alumina such as a beta double prime alumina or other material in positions other than thoe normally occupied by cationic species in the normal, native, conduction planes or bands of the crystal structure. More particularly, intercalation as used herein is to be distinguished from high temperature or other synthetic reactions where aluminas are formed or modified such as from a melt or from the gas phase. The process of intercalation as that term is used herein is more fully described as applied to divalent cationic species in "Divalent Beta" Aluminas; High Conductivity Solid Electrolytes for Divalent Cations" Farrington and Dunn, Solid State Ionics, Vol. 7, No. 4, pp. 267–281 (1982) and in the other publications referred to herein.

All of the terms used herein are to be interpreted in accordance with the usage employed in *Electronic Engineers' Handbook*, Fink et al. ed., 2nd Edition, McGraw-Hill (1982) and *Advanced Inorganic Chemistry, A Comprehensive Text*, Cotton and Wilkinson, 2nd Edition, Interscience Publishers (1967) to the extent that such terms may be found therein and are not inconsistent with the foregoing specific definitions. The foregoing works are incorporated herein by reference.

For certain of the preferred uses herefor, polyvalent cationic species are employed which have been derived from the lanthanide and/or actinide series of elements. In this context, the definitions of lanthanide and actinide suggested in Chapters 31 and 32 of *Advanced Inorganic Chemistry*, which has been incorporated herein by reference, is adopted. Thus the lanthanides include those elements having atomic numbers from 57 through 71 along with Scandium and Yttrium. The actinides include those elements having atomic numbers 89 through 108. While many of these elements and their polyvalent cationic salts are not widely available and have not yet been investigated in connection with this invention, all are believed to have a stable plus 3 or higher oxidation state and are expected to be suitable for use in connection with the practice of one or more embodiments of the present invention.

While the lanthanides are especially useful in the practice of the present invention due to their general suitability for use in the preparation of phosphors and to their widespread use in solid state and other LASER and optical devices, all tri-, tetra-, and higher cationic species are contemplated for employment in connection with the present invention. Thus, polyvalent cationic species may include those ions in the plus 3 or higher cationic state. While it is not to be implied, that all such species will necessarily result in modified beta double prime alumina having useful phosphor or optical properties, to date a wide variety of such species have been intercalated in beta double prime alumina to good effect.

The materials from which the polyvalent cations are derived are most conveniently prepared in the form of salt of the cations. Thus, the halide, sulfate, and other inorganic salts may be conveniently used. Certain organic salts, such as the phenolate, naphthenate, acetate, and other salts may likely also be employed.

In order to prepare the compositions of matter of the present invention, it is necessary only to contact one or more crystals of a beta double prime alumina, such as sodium beta double prime alumina, with a material capable of exchanging polyvalent cations for a monovalent or divalent cation of the beta double prime alumina starting material. An extraordinarily convenient way of accomplishing this intercalation of cationic species is to contact crystals of the beta double prime alumina with a molten bath of a salt of the desired cationic species. Allowing contact with the molten bath to take place for from several hours to several days permits the migration of polyvalent ions into the beta double prime aluminate structure and the migration of monovalent or divalent native cations out of the beta double prime alumina via the conduction bands, and into the molten bath, thus to effect intercalation.

It is also a preferred embodiment of the present invention to contact the crystals of the desired starting beta double prime alumina with a polyvalent cationic species in the gaseous or vaporous form. This may be conveniently accomplished by intimately mixing crystals of the beta double prime alumina and a salt or other suitable compound of the polyvalent cationic species together at a temperature in excess of room temperature but below the melting point of the polyvalent material. Transfer of cations from the polyvalent cationic species is believed to occur via the vapor phase through a process akin to sublimation. While it is not desired to be bound by any particular theory, it is usually possible to accomplish substantial exchange of polyvalent cations for mono- or divalent cations of the starting material, BDPA. The foregoing intercalation reaction may take place in any convenient reaction chamber under a wide variety of reaction conditions.

The material which is employed to contact the crystals of the beta double prime alumina starting material may be modified or altered in composition to result in wide variations in composition of the modified beta double prime aluminas. Thus, mixtures of different polyvalent cationic species as well as mixtures of polyvalent cationic species with monovalent and/or divalent cationic species may be employed for the contacting process to result in similarly mixed products. In accordance with certain preferred embodiments, it is desired to employ members of the lanthanide and/or actinide series of elements as polyvalent cations in the methods of this invention. In any event, however, at least one trivalent, tetravalent or higher cationic species' will be intercalated to a sensible degree during modification of the beta double prime aluminas.

By varying the composition of the polyvalent cationic modifying material together with the reaction conditions, temperatures and reaction times, it is possible to prepare wide varieties of modified beta double prime aluminas. Thus, it is possible to prepare such aluminas having cationic replacement with polyvalent cations approaching 100% replacement. It is also possible to secure fractional percentage replacement with such ions. By employment of mixed cationic species, complex blends of cationic species may be introduced into the beta double prime alumina structure. In short, the present methods provide a convenient means for the modification of beta double prime aluminas to a high degree of precision and over a wide range of compositional variation with only routine experimentation.

The compositions of matter which are prepared in accordance with the present methods may be described as being beta double prime aluminas having a sensible amount of at least one polyvalent cationic species intercalated therein. As has been discussed hereinbefore, intercalation is an appropriate definitive term to distinguish the ion exchange of the present invention from other means of incorporating polyvalent cations into, for example, beta alumina and magnetoplumbite-type materials through high temperature synthetic means. Thus, the methods of the present invention result in the beta double prime aluminas having polyvalent cationic species intercalated therein. That is, the new, polyvalent ions are present in the conduction bands extant within the normal beta double prime alumina crystal structure. No gross modification of the overall crystal structure such as from BDPA to Beta alumina, is believed to result from the intercalation process.

The materials which may thus be prepared are of particular interest to the physical and optical arts in that the beta double prime alumina structure is an ideal one for enforcing isolation of individual atoms held within a crystal lattice. Thus, intercalating a limited number or percentage of polyvalent cations within a beta double prime alumina structure may be accomplished in such a way as to effectively isolate each of the polyvalent cations from one another. Certain of the polyvalent cations which may be intercalated in accordance with this invention will likely be found to have particular utility in fluorescent, phosphorescent, laser, and other optical materials and devices. Thus, certain polyvalent materials, especially the lanthanides, are particularly useful in the preparation of phosphors, for the preparation of phosphorescent coatings for fluorescent lighting devices and for other uses. For example, many of the uses for which phosphors of the instant type may be employed are described in the above-referenced *Electronics Engineer's Handbook*, at, for example, Chapter 11.

In general, optical devices employing the modified beta double prime aluminas of the present invention as sources of fluorescence or phosphorescence will employ beta double prime aluminas having at least one polyvalent cationic species intercalated therein together with a source of radiant energy for impingement upon the beta double prime alumina. The radiant energy is selected to be capable of inducing fluorescence or phosphorescence in the BDPA. In accordance with certain preferred embodiments, the beta double prime alumina will be in the form of a single crystal or collection of single crystals oriented in a preselected fashion.

In accordance with other preferred embodiments, the novel, modified beta double prime aluminas disclosed herein may be employed in solid state laser devices. A general description of such devices may be found in the hereinabove referenced *Electronics Engineers Handbook* at Chapter 11, especially pages 11-15 et seq. FIG. 1 is derived from FIGS. 11-13 of the aforementioned *Electronics Engineers' Handbook*, as a generalized scheme for certain solid state lasers in accordance with the present invention. Thus, optical resonating means, such as mirrors 10 and 12, are provided which define an optical pathway therebetween. The beta double prime alumina, modified in accordance with the present invention by intercalation of at least one polyvalent cationic species, is placed in the optical pathway 14. The beta double prime alumina may preferably be formed into a rod, especially a single crystalline rod, or any other convenient form known to those skilled in the art. Energy supply means 16 such as an optical pumping means are also provided in proximity to the beta double prime alumina 14, but located in such a fashion as not to interfere with the optical pathway. In accordance with preferred embodiments, optical switch 18, such as a Q switch, is included in the optical pathway so as to modify the frequency or duration of the laser pulses 22. It is preferred that control means 20 be provided for controlling the operation of the optical pumping means 16, and optical switch 18, so as to control the timing, duration, and intensity of exiting laser pulses 22. If desired, the reflective chamber 24 may be constructed about the assembly as is well to those skilled in the art.

The beta double prime aluminas modified in accordance with the present invention are ideally suited for use in laser devices. Thus, they exhibit high thermal conductivities, are easily fabricated, are extraordinarily hard and able to be finished to an optical precision, are generally impervious to radiation, are chemically inert, and may be had with extraordinary uniformity and optical purity. The ability of modified beta double prime aluminas to be formulated with very precise percentages of intercalated ions, which ions are precisely located within the conduction bands of the crystal structure of the beta double prime alumina is a further, important property of these materials. Thus, individual, optically stimulatable ions may be isolated one from the other within the crystalline structure of the beta double prime alumina. This permits optimized efficiencies for laser and other uses by minimizing non-radiative decay of induced excited states. Accordingly, it is possible to provide laser host beta double prime aluminas which can be "doped" with intercalated ions to a much higher degree than most if not all previous materials. This ability is expected to be reflected in higher powers per unit of size or weight than have previously been found possible. This expectation is reflected in the comparison of fluorescence lifetime as a function of concentration of neodymium in sodium BDPA in accordance with the present invention as compared with that of a commercial laser host, YAG. This comparison is depicted in Table 3. The ability to establish higher concentrations of active species within a laser host as taught by the present invention as compared to those in the prior art will be readily apparent to those of ordinary skill in the art.

The following examples are intended as illustrative only and not as limiting.

EXAMPLE 1

Pure crystals of sodium beta double prime alumina may be prepared in accordance with the procedure of Briant and Farrington, "Ionic Conductivity in Na+, K+ and Ag+ β Alumina", Solid State Chemistry, Vol. 33, pp. 385-390 (1980) which publication is incorporated herein by reference. High quality single crystals of sodium beta double prime gallate may be grown in a similar manner at temperatures of approximately 1350° C., as compared With the 1700° C. required for sodium beta double prime aluminates.

EXAMPLE 2

Molten Salt Exchange: Beta double prime alumina compositions intercalated with trivalent cations can be prepared by immersing single crystals (typically 2 mm×1 mm×0.2 mm) of sodium beta double prime alumina in a molten salt containing a significant concentration of trivalent cations. For example, single crystals of sodium beta double prime alumina undergo the following intercalation exchanges.

TABLE 1

| Ion(+3) | Melt | T (°C.) | Time (h) | % Exchange |
|---|---|---|---|---|
| Gd | $GdCl_3$ | 615 | 5 | 100 |
| Nd | $NdBr_3$ | 720 | 0.5 | 95 |
| Nd | $45NdCl_3/55NaCl$ | 600 | 12 | 53 |
| Eu | $EuCl_3$ | 870 | 20 | 95 |
| Yb | $YbCl_3$ | 740 | 24 | 90 |
| Sm | $SmCl_3$ | 700 | 20 | 90 |
| Tb | $TbCl_3$ | 740 | 48 | 90 |
| Dy | $DyCl_3$ | 1000 | 0.5 | 70 |
| Bi | $BiCl_3$ | 270 | 12 | 70 |
| Pr | $37PrCl_3/63NaCl$ | 600 | 54 | 43 |

Note that the group includes lanthanide ions as well as $Bi^{3+}$, a non-lanthanide ion.

EXAMPLE 3

Vapor-Phase Exchange: Intercalation also occurs when one or more crystals of sodium beta double prime alumina is exposed to an exchanging salt at temperatures below the melting point of the salt. For example:

TABLE 2

| Ion | Salt | T (°C.) | Time | % Exchange |
|---|---|---|---|---|
| $Eu^{+2}$ | $EuCl_2$ | 600 | 2 min. | 30 |
| $Eu^{+3}$ | $EuCl_3$ | 650 | 24 hrs | 100 |
| $Sm^{+2}$ | $SmCl_2$ | 530 | 7 days | 10 |
| $Sm^{+3}$ | $SmCl_3$ | 530 | 7 days | 70 |
| $Nd^{+3}$ | $NdBr_3$ | 600 | 24 hrs. | 100 |

The extent of intercalation can be measured by either labeling the Sodium content of the starting crystal with radioactive $^{22}Na$ so that the residual sodium in the crystal after exchange can be easily determined by measuring its relative radioactive strength compared to the starting crystal. Such exchange may also be evaluated by measuring the weight change produced by the process.

EXAMPLE 4

It is expected that similar intercalation, exchange reactions will occur if another ion, either mono-, di-, or tri-valent is present in the starting crystal instead of sodium. Other starting crystals, including, for example, $Ag^+$, $K^+$, $Pb^{+2}$, $Ca^{+2}$, or $Nd^{+3}$ beta double prime aluminas are expected to undergo intercalation. Successful exchanges should also occur if mixed starting compositions, such as $Na^+ - K^+$ or $Na^+ - Pb^{+2}$, were used. Combinations of mono-, di-, and trivalent salts may also be used to prepare specific mixed compositions in the final crystals.

EXAMPLE 5

It is also reasonable to expect that similar exchange reactions should occur with gallate analog beta double prime aluminas in which Ga has replaced Al in the beta double prime alumina structure, or with the beta double prime ferrites, in which Fe has replaced Al in the beta double prime alumina structure. Beta double prime alumina compositions in which Al and Ga and Fe are intermixed in the basic structure are also expected to form polyvalent, intercalated derivatives.

EXAMPLE 6

Preparation of Tetravalent Beta Prime Aluminas: Tetravalent cations also replace the ionic content of beta double prime alumina through intercalation. For example, 35% of the $Zn^{+2}$ beta double prime alumina (about 2 mm×1 mm×0.2 mm) was replaced by $Th^{+4}$ when the crystal was heated in powdered $ThCl_4$ at 600°-700° C. for 18 hours.

EXAMPLE 7

Optical Properties: The lanthanide intercalated beta double prime aluminas are optically significant. For example, under long wave ultraviolet radiation, $Nd^{+3}$ fluoresces blue, $Eu^{2+}$ fluoresces yellow-green, $Eu^{+3}$ fluoresces red, $Sm^{+2}$ fluoresces yellow, and $Sm^{+3}$ fluoresces red.

A more detailed investigation of the fluorescence behavior of $Nd^{+3}$ beta double prime alumina has been carried out. Using standard spectroscopic apparatus, it was found that the fluorescence spectrum of $Nd^{+3}$ beta double prime alumina is generally similar to that of $Nd^{+3}$ in $Y_3Al_5O_{12}$ (YAG). The optical transitions and linewidths are virtually the same for both compositions, the only difference being that the $Nd^{+3}$ spectrum in beta double prime alumina is shifted to shorter wavelengths by about 10 nm.

The fluorescence lifetime of the $^4F_{3/2}$ state of $Nd^{+3}$ beta double prime alumina was measured as a function of $Nd^{+3}$ concentration. Table 3 compares the results for the $^4F_{3/2}$ state of $Nd^{+3}$ in beta double prime alumina, YAG, and $La_{1+x}Nd_xMgAl_{11}O_{19}$ (LNA) host materials. LNA, an aluminate with the magnetoplumbite structure,s has been mentioned as a candidate material for high power laser applications. See A. Kahn et al., J. Appl. Phys., Vol. 52, p. 6864 (1981).

TABLE 3

Fluorescence Lifetime for $Nd^{3+}$ in Various Host Materials

| Host Material | $Nd^{3+}$ Concentration (cm$^{-3}$) | Fluorescence Lifetime (μs) |
|---|---|---|
| BDPA | $4.0 \times 10^{19}$ | 395 |
|  | $8.5 \times 10^{20}$ | 350 |
|  | $1.5 \times 10^{21}$ | 350 |
| YAG | ca. $1.4 \times 10^{20}$ | 240 |
| LNA | $3 \times 10^{19}$ | 360 |
|  | $3.4 \times 10^{20}$ | 260 |
|  | $1.1 \times 10^{21}$ | 52 |

What is claimed is:

1. Beta double prime alumina comprising aluminum and oxygen included in a beta double prime alumina structure having a sensible amount of at least one polyvalent cationic specie intercalated therein.

2. The beta double prime alumina of claim 1 further comprising one or more mono- or divalent cationic species.

3. The beta double prime alumina of claim 1 wherein said polyvalent species is derived from the lanthanide series of elements.

4. The beta double prime alumina of claim 1 wherein said polyvalent species is derived from the actinide series of elements.

5. The beta double prime alumina of claim 1 wherein said cationic species is trivalent.

6. The beta double prime alumina of claim 1 wherein said cationic species is tetravalent.

7. The beta double prime alumina of claim 1 exhibiting a sensible phosphorescence or fluorescence.

8. The beta double prime alumina of claim 1 in the form of a single crystal.

9. The beta double prime alumina of claim 1 comprising a gallium analog.

10. A method for modifying a beta double prime alumina comprising:
providing one or more crystals of beta double prime alumina; and
contacting said crystals with a material comprising at least one salt of a polyvalent cationic species at a temperature and for a time sufficient to cause migration of polyvalent cations from the salt into the crystal to a sensible degree.

11. The method of claim 10 wherein the material is in a molten state.

12. The method of claim 10 wherein the material is at a temperature above room temperature but below the melting point temperature of the salt.

13. The method of claim 12 wherein said contacting is of a gaseous phase of the salt.

14. The method of claim 10 wherein said material comprises a mixture of salts.

15. The material of claim 10 wherein said material further comprises one or more mono- or divalent cationic species.

16. The method of claim 10 wherein said polyvalent cationic species is derived from the lanthanide series of elements.

17. The method of claim 10 wherein said polyvalent cationic species is derived from the actinide series of elements.

18. The method of claim 10 wherein said polyvalent cationic species is trivalent.

19. The method of claim 10 wherein said polyvalent cationic species is tetravalent.

20. The method of claim 10 wherein said material comprises a mixture of cationic species.

21. The method of claim 10 further comprising applying radiant energy to said crystals to produce phosphorescence or fluorescence.

22. The method of claim 10 wherein the beta double prime alumina comprises a gallium analog.

* * * * *